United States Patent
Sato et al.

(10) Patent No.: US 11,830,795 B2
(45) Date of Patent: Nov. 28, 2023

(54) SEMICONDUCTOR DEVICE, POWER CONVERSION DEVICE, AND METHOD FOR MANUFACTURING SEMICONDUCTOR DEVICE

(71) Applicant: Mitsubishi Electric Corporation, Tokyo (JP)

(72) Inventors: Yuji Sato, Tokyo (JP); Yoshinori Yokoyama, Tokyo (JP); Motoru Yoshida, Tokyo (JP); Jun Fujita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 109 days.

(21) Appl. No.: 17/609,424

(22) PCT Filed: Jul. 4, 2019

(86) PCT No.: PCT/JP2019/026683
§ 371 (c)(1),
(2) Date: Nov. 8, 2021

(87) PCT Pub. No.: WO2021/002006
PCT Pub. Date: Jan. 7, 2021

(65) Prior Publication Data
US 2022/0230945 A1    Jul. 21, 2022

(51) Int. Cl.
*H01L 23/498* (2006.01)
*H01L 23/053* (2006.01)
*H01L 23/00* (2006.01)

(52) U.S. Cl.
CPC ...... *H01L 23/49811* (2013.01); *H01L 23/053* (2013.01); *H01L 24/48* (2013.01);
(Continued)

(58) Field of Classification Search
CPC . H01L 23/49811; H01L 23/053; H01L 24/48; H01L 2224/48245;
(Continued)

(56) References Cited

U.S. PATENT DOCUMENTS

2012/0074542 A1* 3/2012 Soyano ............... H01L 25/16
257/659

FOREIGN PATENT DOCUMENTS

| JP | 7-058282 A | 3/1995 |
| JP | 2017-103279 A | 6/2017 |

OTHER PUBLICATIONS

International Search Report and Written Opinion dated Aug. 27, 2019, received for PCT Application PCT/JP2019/026683, Filed on Jul. 4, 2019, 8 pages including English Translation.

* cited by examiner

*Primary Examiner* — Elias Ullah
(74) *Attorney, Agent, or Firm* — XSENSUS LLP

(57) ABSTRACT

A semiconductor device includes a base plate, a substrate, a semiconductor element, a case, and a wiring terminal. The case is disposed on the base plate so as to cover the substrate and the semiconductor element. The wiring terminal is electrically connected to the semiconductor element. The case includes a first case unit and a second case unit that is separate from the first case unit. The wiring terminal includes a first wiring unit and a second wiring unit. The first wiring unit is disposed so as to protrude from an inside to an outside of the case, and is electrically connected to the semiconductor element. The second wiring unit is bent with respect to the first wiring unit and disposed outside the case. The first case unit and the second case unit are disposed so as to sandwich the first wiring unit.

10 Claims, 11 Drawing Sheets

(52) U.S. Cl.
CPC ............... *H01L 2224/48245* (2013.01); *H01L 2924/14252* (2013.01)

(58) Field of Classification Search
CPC ........... H01L 2924/14252; H01L 24/01; H01L 2924/13055; H01L 2924/13091; H01L 2924/16195; H01L 2924/16315; H01L 21/481; H01L 23/10; H01L 24/80; H01L 23/057

See application file for complete search history.

SEMICONDUCTOR DEVICE, POWER CONVERSION DEVICE, AND METHOD FOR MANUFACTURING SEMICONDUCTOR DEVICE

CROSS-REFERENCE TO RELATED APPLICATION

The present application is based on PCT filing PCT/JP2019/026683, filed Jul. 4, 2019, the entire contents of which are incorporated herein by reference.

TECHNICAL FIELD

The present invention relates to a semiconductor device, a power conversion device, and a method for manufacturing the semiconductor device.

BACKGROUND ART

Conventionally, a semiconductor device includes a wiring terminal connecting the semiconductor device and an external device. A part of the wiring terminal is exposed to the outside of a case through a through-hole made in the case of the semiconductor device. For example, in a semiconductor device described in Japanese Patent Laying-Open No. 7-58282 (PTL 1), a semiconductor element is attached to a metal plate disposed on a mounting substrate through an insulating substrate. An electrode terminal (wiring terminal) is bonded to the metal plate. After the case is bonded to the mounting substrate, the part of the electrode terminal (wiring terminal) exposed, through the through-hole made in the case, to the outside of the case is bent.

CITATION LIST

Patent Literature

PTL 1: Japanese Patent Laying-Open No. 7-58282

SUMMARY OF INVENTION

Technical Problem

In the semiconductor device described in PTL 1, after the case is bonded to the mounting substrate (base plate), the part of the electrode terminal (wiring terminal) exposed, through the through-hole made in the case, to the outside of the case is bent. Consequently, when the part of the electrode terminal (wiring terminal) is bent, mechanical force is applied to a bonding unit between the electrode terminal (wiring terminal) and the metal plate, so that sometimes the electrode terminal (wiring terminal) is peeled off from the metal plate.

The present invention has been made in view of the above problems, and an object of the present invention is to provide a semiconductor device, a power conversion device, and a method for manufacturing the semiconductor device capable of preventing peeling-off of the wiring terminal.

Solution to Problem

A semiconductor device includes a base plate, a substrate, a semiconductor element, a case, and a wiring terminal. The substrate is disposed on the base plate. The semiconductor element is electrically connected to the substrate. The case is disposed on the base plate so as to cover the substrate and the semiconductor element. The wiring terminal is electrically connected to the semiconductor element. The case includes a first case unit and a second case unit that is separated from the first case unit. The wiring terminal includes a first wiring unit and a second wiring unit. The first wiring unit is disposed so as to protrude from an inside of the case to an outside, and is bonded to at least one of the semiconductor element and the substrate. The second wiring unit is bent with respect to the first wiring unit and is disposed outside the case. The first case unit and the second case unit are disposed so as to sandwich the first wiring unit.

Advantageous Effects of Invention

According to the semiconductor device of the present invention, the second wiring unit is bent with respect to the first wiring unit and disposed outside the case. The first case unit and the second case unit are disposed so as to sandwich the first wiring unit. For this reason, application of mechanical force bending the wiring terminal can be prevented while the first wiring unit is bonded to at least one of the semiconductor element and the substrate. Consequently, peeling of the wiring terminal from at least one of the semiconductor element or the substrate can be prevented.

DESCRIPTION OF EMBODIMENTS

Figure 1:
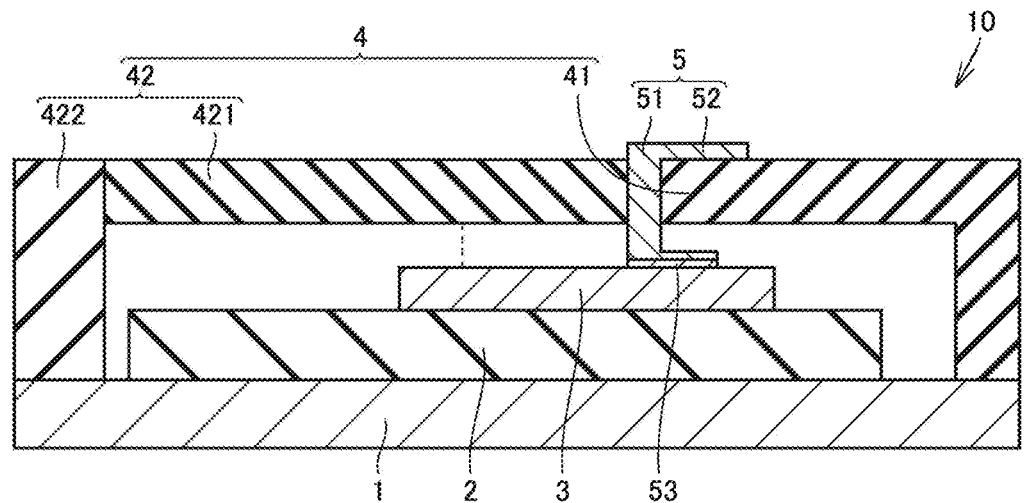
FIG. 1 is a sectional view schematically illustrating a first configuration of a configuration of a semiconductor device according to a first embodiment of the present invention.

With reference to the drawings, embodiments of the present invention will be described below. In the following description, the same or corresponding parts are denoted by the same reference numerals, and overlapping description will not be repeated.

First Embodiment

Figure 2:
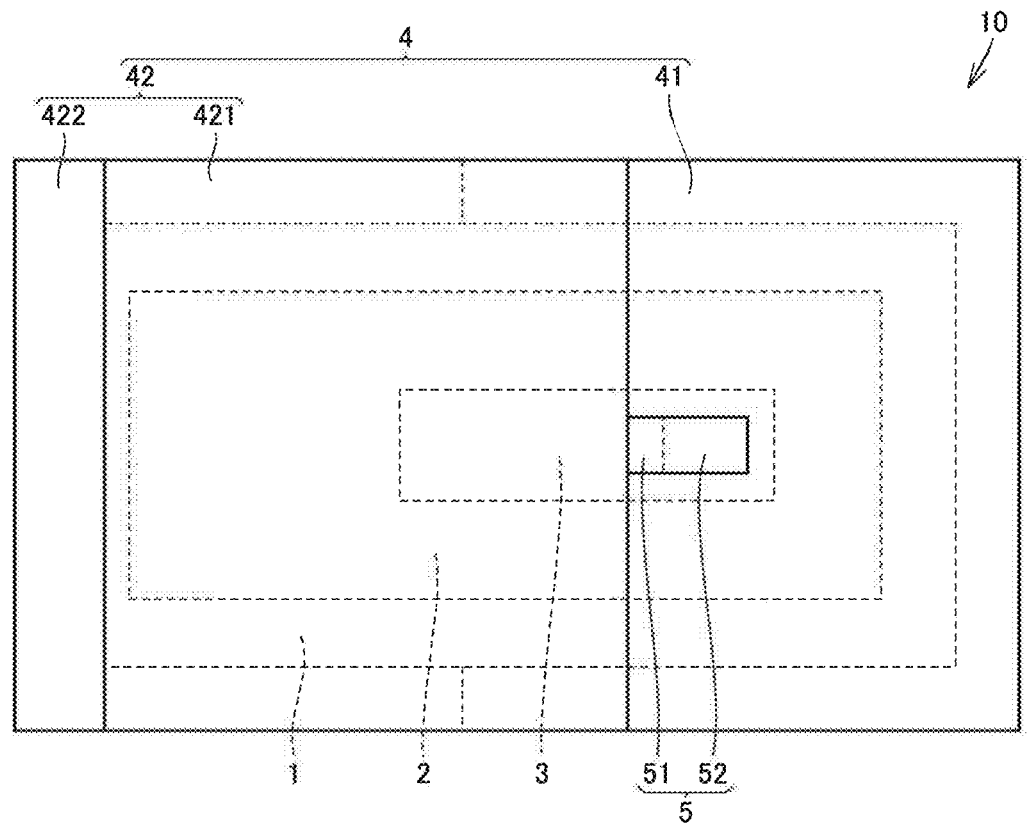
FIG. 2 is a plan view schematically illustrating the first configuration of the configuration of the semiconductor device according to the first embodiment of the present invention.

With reference to FIGS. 1 and 2, a first configuration of a semiconductor device 10 according to a first embodiment will be described. FIG. 1 is a sectional view schematically illustrating a first configuration of semiconductor device 10 according to the first embodiment. FIG. 2 is a plan view schematically illustrating the first configuration of semiconductor device 10 according to the first embodiment.

Semiconductor device 10 includes a base plate 1, a substrate 2, a semiconductor element 3, a case 4, and a wiring terminal 5. Semiconductor device 10 is a power semiconductor device for electric power.

Base plate 1 is a base of semiconductor device 10. A shape of base plate 1 is mainly a plate shape. A material of base plate 1 is mainly copper (Cu), aluminum (Al), or the like. Base plate 1 may be mainly made of a material other than the above-described material, or may be a composite material of the above-described material and another material. The material and shape of base plate 1 are not limited thereto as long as a function of semiconductor device 10 is not impaired. In addition, a structure of base plate 1 may be appropriately determined as long as the function of semiconductor device 10 is not impaired.

Substrate 2 is disposed on base plate 1. Substrate 2 includes an insulating layer and a metal layer. For example, the structure of substrate 2 is a structure in which metal layers are formed on both surfaces of the insulating layer. With this structure, substrate 2 is bonded to base plate 1 and semiconductor element 3. In addition, this structure enables energization between substrate 2 and base plate 1 and between substrate 2 and semiconductor element 3. For example, the insulating layer is a ceramic plate or an insulating sheet containing an organic component. For example, the material of the ceramic plate is aluminum oxide ($Al_2O_3$), silicon nitride ($Si_3N_4$), or aluminum nitride (AlN). For example, the material of the metal layer is gold (Au) or copper (Cu). The structure of the metal layer may be a single-layer structure in which only one kind of these metals is used, or may be a laminated structure in which a plurality of kinds of metals are used. The material and structure of substrate 2 are not limited thereto as long as the function of semiconductor device 10 is not impaired. Furthermore, the shape of substrate 2 may be appropriately determined as long as the function of semiconductor device 10 is not impaired.

Semiconductor element 3 is electrically connected to substrate 2. The material of semiconductor element 3 is silicon (Si), silicon carbide (SiC), or the like. For example, the material of semiconductor element 3 may be gallium nitride (GaN) in addition to the above-described materials. The structure of semiconductor element 3 is an insulated gate bipolar transistor (IGBT), a metal oxide semiconductor field effect transistor (MOSFET), or the like. A thickness of semiconductor element 3 may be appropriately selected according to design. For example, the thickness of semiconductor element 3 is greater than or equal to 50 μm and less than or equal to 500 μm.

Semiconductor element 3 includes an electrode and a metal film (not illustrated) on a front surface and a back surface. The material of the electrode and the metal film is mainly aluminum (Al), copper (Cu), nickel (Ni), or the like. The material of the electrode is not limited thereto. The material, structure, shape, and the like of semiconductor element 3 are not limited to those described above, but the material, structure, shape, and the like of semiconductor element 3 may be appropriately determined as long as the function of semiconductor device 10 is not impaired and the electrode can be formed.

Semiconductor element 3 may further include an adhesion layer, a barrier layer, and an antioxidant layer. The material of the adhesion layer, the barrier layer, and the antioxidant layer is gold (Au), titanium (Ti), titanium nitride (TiN), tungsten (W), or the like. The structure of semiconductor element 3 may be a laminated structure of greater than or equal to two layers in which the metal film, the adhesion layer, the barrier layer, and the antioxidant layer are appropriately combined. The materials and configurations of the metal film, the adhesion layer, the barrier layer, and the antioxidant layer are not limited thereto. The thicknesses of the metal film, the adhesion layer, the barrier layer, and the antioxidant layer may be appropriately determined according to the design. For example, the thickness of each of the metal film, the adhesion layer, the barrier layer, and the antioxidant layer is greater than or equal to 5 nm and less than or equal to 50 μm. The method for forming the metal film, the adhesion layer, the barrier layer, and the antioxidant layer is mainly plating, sputtering, or the like. The method for forming the metal film, the adhesion layer, the barrier layer, and the antioxidant layer is not limited thereto, and may be appropriately determined as necessary.

Case 4 is disposed on base plate 1 so as to cover substrate 2 and semiconductor element 3. Case 4 is in contact with base plate 1 at greater than or equal to one side. Specifically, case 4 is formed so as to cover a side surface of substrate 2 and an upper surface of semiconductor element 3. Case 4 includes a side wall. The side wall is formed in a frame shape so as to surround the side surface of substrate 2. A region where case 4 covers substrate 2 and semiconductor element 3 is defined as an inside. A region outside case 4 is defined as an outside.

Case 4 includes a first case unit 41 and a second case unit 42 that is separate from first case unit 41. Case 4 is divided into first case unit 41 and second case unit 42. Case 4 is a separate structure divided into greater than or equal to two. First case unit 41 and second case unit 42 are disposed so as to sandwich a first wiring unit 51 of wiring terminal 5 described later. First case unit 41 and second case unit 42 are in contact with base plate 1.

Case 4 includes a divided portion. First case unit 41 and second case unit 42 are configured to be divided at the divided portion. The divided portion has a contact point with base plate 1. An angle formed by the divided portion and base plate 1 is larger than 0 degrees and smaller than 360 degrees. The position, the number, and the shape of case 4 to be divided may be appropriately determined according to the design of semiconductor device 10.

Second case unit 42 includes a lid 421 and a main body 422. Lid 421 is opposite to base plate 1. Main body 422 forms an outer periphery of case 4. An opening is provided in an upper portion of case 4. Lid 421 covers the opening.

In order to ensure insulation of semiconductor device 10, the material of case 4 has insulation. For example, the material of case 4 is a poly phenylene sulfide resin (PPS resin). The structure, material, and shape of case 4 may be appropriately determined as long as the function of semiconductor device 10 and the function and effect of the first embodiment are not impaired.

Wiring terminal 5 is electrically connected to semiconductor element 3.

Wiring terminal 5 includes first wiring unit 51 and a second wiring unit 52. First wiring unit 51 is disposed so as to protrude from the inside to the outside of case 4. First wiring unit 51 is bonded to semiconductor element 3. First wiring unit 51 is electrically connected to semiconductor element 3. Second wiring unit 52 is disposed outside case 4. Second wiring unit 52 is bent with respect to first wiring unit 51.

Before wiring terminal 5 is bonded, machining such as bending or cutting is previously performed on wiring terminal 5, and wiring terminal 5 is bent at least once in the middle. Thus, first wiring unit 51 and second wiring unit 52 are formed in wiring terminal 5. For this reason, second wiring unit 52 is not in a straight line with first wiring unit 51. First wiring unit 51 and semiconductor element 3 are bonded through a bonding unit 53. Bonding unit 53 may include a conductive bonding material described later.

For example, the material of wiring terminal 5 is aluminum (Al) or copper (Cu). Wiring terminal 5 may contain what is called a dissimilar material such as other metals and organic components, and the surface of wiring terminal 5 may be coated with the dissimilar material. For example, the shape of wiring terminal 5 is a plate, a foil, or a wire. The structure, material, and shape of wiring terminal 5 may be appropriately determined as long as the function of semiconductor device 10 and the function and effect of the first embodiment are not impaired. In order to obtain the function and effect of the first embodiment, the shape of wiring terminal 5 needs to be the shape at the time of product use when wiring terminal 5 is bonded to substrate 2.

Bonding unit 53 may further include an intermediate layer. For example, the thickness of bonding unit 53 including the intermediate layer is greater than or equal to 0.1 μm and less than or equal to 2000 μm. For example, the intermediate layer includes a stress buffer layer buffering stress. Thus, in a reliability test, the stress applied to bonding unit 53 can be relaxed. For example, the material of the stress buffer layer is invariant steel (invar), molybdenum (Mo), tungsten (W), or an alloy containing these materials. The structure of the stress buffer layer is a single layer structure in which a single type of material is used or a laminated structure in which a plurality of types of materials are used. When the structure of the stress buffer layer is a laminated structure, a ratio of each of the laminated layers may be any ratio. The material, shape, and structure of the intermediate layer may be appropriately determined as long as the function and effect of the first embodiment are not impaired.

A bonding material (not illustrated) is used as necessary when a component included in semiconductor device 10 is bonded to another component. The bonding material includes an insulating bonding material or a conductive bonding material.

The insulating bonding material is used for bonding first case unit 41 and the second case unit 42, and base plate 1 and case 4. The insulating bonding material has an insulating property. For example, the insulating bonding material is a silicone adhesive. First case unit 41 and second case unit 42, and base plate 1 and case 4 are bonded to each other without any gap by the insulating bonding material.

The conductive bonding material is used for bonding base plate 1 and substrate 2, substrate 2 and semiconductor element 3, substrate 2 and wiring terminal 5, and semiconductor element 3 and wiring terminal 5. The conductive bonding material has conductivity. For example, the conductive bonding material is solder, a metal sintered body, or a liquid phase diffusion bonding material. The solders include solder containing lead and solder not containing lead. In addition, as a bonding method using solder, there are various bonding methods such as a method in which reflow is performed on solder in a reducing atmosphere or a method in which a temperature of solder is increased in an inert gas. The solder bonding method is not limited thereto as long as the function and effect of the first embodiment are not impaired. In addition, even in the case of bonding using a sintered body or a liquid phase diffusion bonding material, the bonding method may be appropriately determined as long as there is no problem in using the product.

Examples of the environment in which bonding is performed using the bonding material include a depressurized environment, an atmospheric pressure environment, a pressurized environment, and an environment of a reducing atmosphere by hydrogen or formic acid. The environment in which the bonding is performed using the bonding material may be appropriately determined.

An insulating sealing material may be provided inside case 4. The insulating sealing material is a gel-like material or a resin insulating material such as epoxy. Thus, the insulation of semiconductor device 10 can be enhanced.

Figure 3:
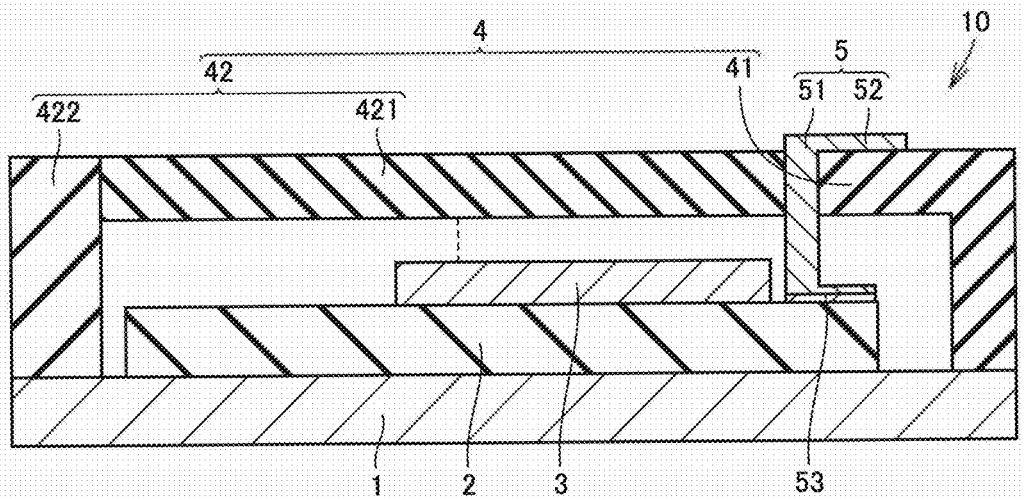
FIG. 3 is a sectional view schematically illustrating a second configuration of the semiconductor device according to the first embodiment of the present invention.
Figure 4:
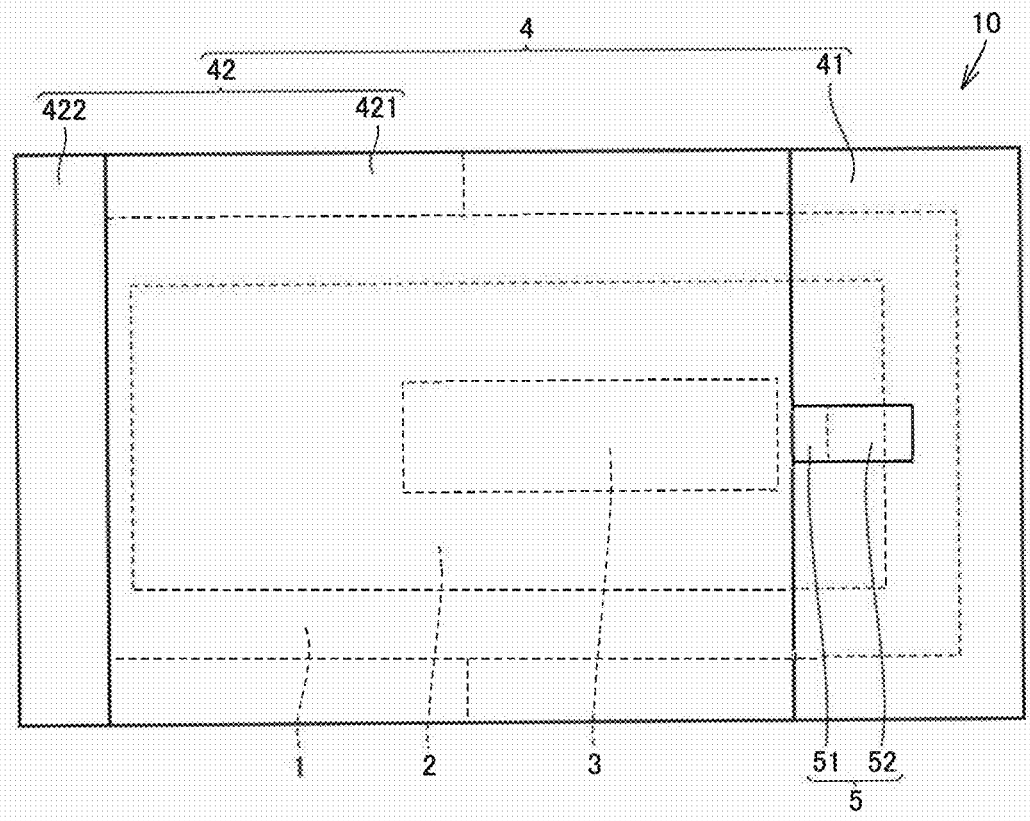
FIG. 4 is a plan view schematically illustrating the second configuration of the semiconductor device according to the first embodiment of the present invention.

With reference to FIGS. 3 and 4, a second configuration of semiconductor device 10 of the first embodiment will be described below. FIG. 3 is a sectional view schematically illustrating a second configuration of semiconductor device 10 according to the first embodiment. FIG. 4 is a plan view schematically illustrating the second configuration of semiconductor device 10 according to the first embodiment.

In the second configuration of the first embodiment, first wiring unit 51 of wiring terminal 5 is bonded to substrate 2. Therefore, bonding unit 53 is formed between first wiring unit 51 and substrate 2. Which one of semiconductor element 3 and substrate 2 is bonded to first wiring unit 51 may be appropriately determined according to the design of semiconductor device 10.

Figure 5:
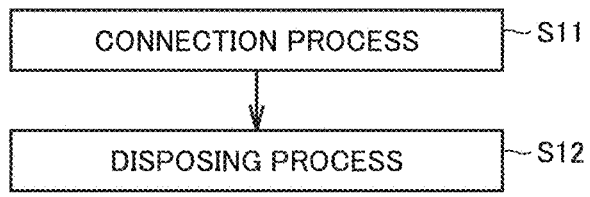
FIG. 5 is a flowchart illustrating a method for manufacturing the semiconductor device according to the first embodiment of the present invention.
Figure 6:
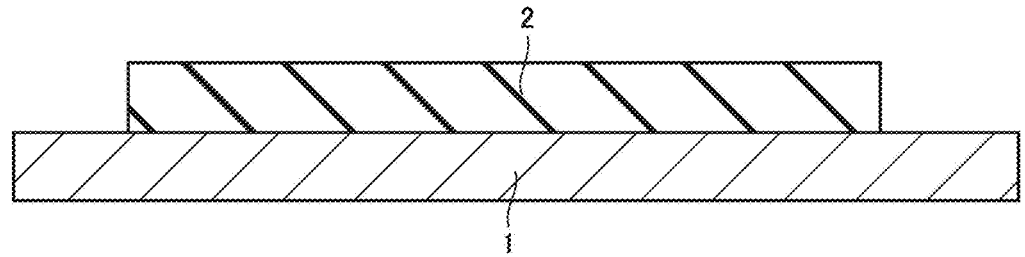
FIG. 6 is a sectional view schematically illustrating a first process of the method for manufacturing the semiconductor device according to the first embodiment of the present invention.
Figure 7:
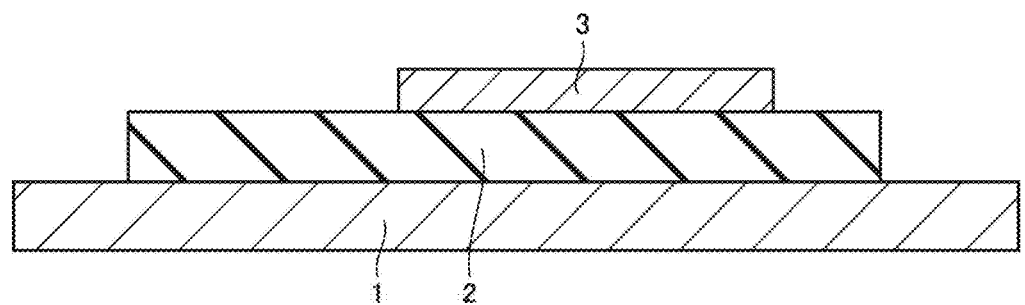
FIG. 7 is a sectional view schematically illustrating a second process of the method for manufacturing the semiconductor device according to the first embodiment of the present invention.
Figure 8:
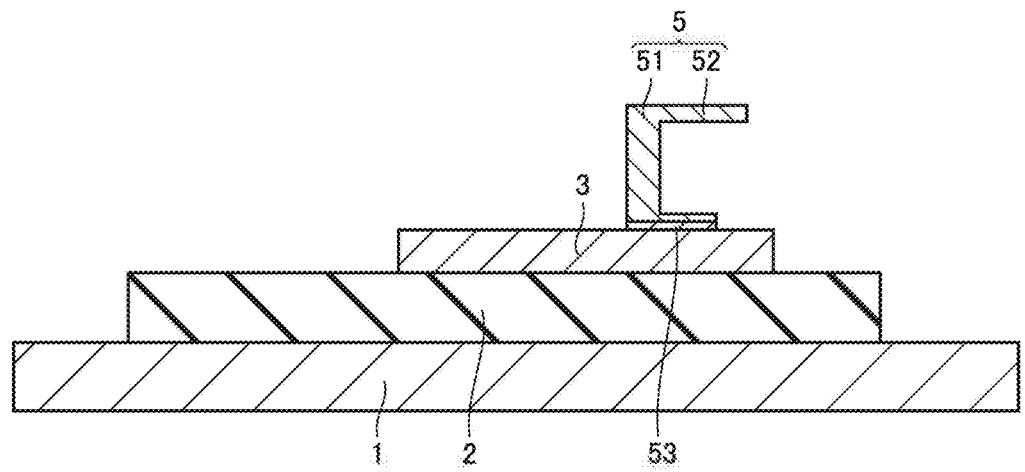
FIG. 8 is a sectional view schematically illustrating a third process of the method for manufacturing the semiconductor device according to the first embodiment of the present invention.
Figure 9:
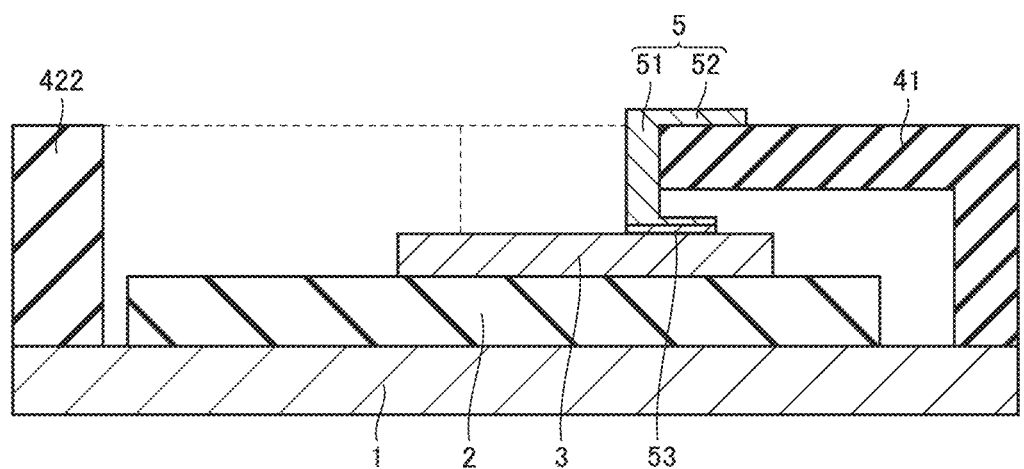
FIG. 9 is a sectional view schematically illustrating a fourth process of the method for manufacturing the semiconductor device according to the first embodiment of the present invention.

With reference to FIGS. 5 to 9, a method for manufacturing semiconductor device 10 according to the first embodiment will be described below. FIG. 5 is a flowchart illustrating the method for manufacturing semiconductor device 10 according to the first embodiment. The method for manufacturing semiconductor device 10 of the first embodiment includes a connection process S11 and a disposing process S12. Connection process S11 includes a first process, a second process, and a third process. Disposing process S12 includes a fourth process and a fifth process. FIG. 6 is a sectional view illustrating the first process. FIG. 7 is a sectional view illustrating the second process. FIG. 8 is a sectional view illustrating the third process. FIG. 9 is a sectional view illustrating the fourth process.

In connection process S11, substrate 2 is disposed on base plate 1. Semiconductor element 3 is electrically connected to substrate 2. First wiring unit 51 of wiring terminal 5 is electrically connected to semiconductor element 3. Wiring terminal 5 includes first wiring unit 51 and a second wiring unit 52. Second wiring unit 52 is bent with respect to first wiring unit 51.

In the first process, substrate 2 is bonded to base plate 1. In the second process, semiconductor element 3 is bonded to substrate 2. In the third process, first wiring unit 51 is bonded to substrate 2 or semiconductor element 3. Wiring terminal 5 bonded to substrate 2 in the third process has a shape at the time of product use. Consequently, in connection process S11, machining is not performed on wiring terminal 5. The order of performing the first process, the second process, and the third process is in random order.

A conductive bonding material is used for bonding base plate 1 and substrate 2 and bonding substrate 2 and semiconductor element 3. A conductive bonding material, heat, ultrasonic energy, or the like is further used for bonding semiconductor element 3 and first wiring unit 51 and bonding substrate 2 and first wiring unit 51. In the case of bonding using the heat, a source of the heat is a laser, electric heat, or the like. In the case of bonding using ultrasonic waves, energy of the ultrasonic wave is appropriately determined according to the material used for wiring terminal 5.

Bonding unit 53 is formed between semiconductor element 3 and first wiring unit 51 or between substrate 2 and first wiring unit 51. A method for forming bonding unit 53 may be appropriately determined. Bonding unit 53 may be formed using a conductive bonding material. In addition, bonding unit 53 may be formed on the surface of semiconductor element 3 by performing a chemical vapor growth method (CVD method) or a physical vapor growth method (PVD method).

For example, the chemical vapor growth method is plating. A type of the plating include electroless plating and electrolytic plating. The type of plating, the forming process, the technique, and the forming condition may be appropriately determined as long as intended bonding unit 53 can be formed. When either the electroless plating or the electrolytic plating is performed, it is necessary to form a base layer and, if necessary, an adhesion layer on the surface of the insulating oxide film in order to enable the deposition of the plating. As a method for forming the base layer and the adhesion layer, there is the chemical vapor growth method or the physical vapor growth method described later. The method for forming the base layer and the adhesion layer may be either the chemical vapor growth method or the physical vapor growth method as long as the method does not affect the formation of the plating and provides a target plating. In consideration of the configuration of semiconductor device 10 and the thicknesses of the seed layer and the base layer necessary for forming the adhesion layer, particularly desirably the base layer and the adhesion layer are formed using sputtering film formation described later.

For example, the physical vapor growth method is sputtering film formation. There are many methods for sputtering film formation, such as magnetron sputtering, vapor deposition, and ion beam sputtering. A power supply used for sputtering film formation is a DC power source or an AC power source. There are many conditions in which the sputtering film formation is performed, such as presence or absence of heating, presence or absence of assisted film formation, input power, and a flow rate. The sputtering film forming method, the power supply, and the conditions may be appropriately determined as long as intended bonding unit 53 can be formed.

When bonding unit 53 further includes an intermediate layer, the method for forming the intermediate layer may be appropriately determined according to the purpose of the intermediate layer.

In disposing process S12, case 4 is disposed so as to cover substrate 2 and semiconductor element 3 that are disposed on base plate 1. Case 4 includes a first case unit 41 and a second case unit 42 that is separate from first case unit 41. In disposing process S12, first wiring unit 51 further protrudes from the inside to the outside of case 4. Second wiring unit 52 is disposed outside case 4. First wiring unit 51 is sandwiched between first case unit 41 and the second case unit 42.

Second wiring unit 52 is bent with respect to first wiring unit 51. For this reason, the wiring terminal 5 is bent outside the case 4. In the fourth process, first case unit 41 and main body 422 of second case unit 42 are bonded to base plate 1 to form case 4 having the opening. Second wiring unit 52 may be supported by first case unit 41. In the fifth process, lid 421 is bonded to main body 422, and the opening is closed, whereby case 4 is formed.

In disposing process S12, first case unit 41 and second case unit 42 are bonded by order and a method in which the stress is not applied to wiring terminal 5, and case 4 is formed. For example, first case unit 41 and second case unit 42 slide from the side of substrate 2 and semiconductor element 3 so as to sandwich first wiring unit 51, and are bonded. Thus, case 4 is formed on base plate 1 so as to cover substrate 2 and semiconductor element 3. Thus, case 4 is formed without applying the stress to wiring terminal 5 bent outside case 4 and bonding unit 53.

The advantageous effect of the first embodiment will be described below.

Semiconductor device 10 according to the first embodiment includes case 4 in which wiring terminal 5 is formed so as to be sandwiched from both sides by first case unit 41 and second case unit 42. For this reason, wiring terminal 5 processed previously into a shape at the time of product use can be used. Accordingly, it is not necessary to bend wiring terminal 5 after bonding case 4. Consequently, mechanical force bending wiring terminal 5 is not applied to bonding unit 53 between wiring terminal 5 and substrate 2 or semiconductor element 3, so that the peeling of wiring terminal 5 can be prevented.

In the first embodiment, case 4 can be formed in a frame shape even in the state where previously-bent wiring terminal 5 is bonded. Accordingly, it is not necessary to perform machining on wiring terminal 5 after case 4 is formed, so that the stress applied to wiring terminal 5 and bonding unit 53 can be reduced. Consequently, the long-term reliability of semiconductor device 10 is improved.

Case 4 includes at least two members of first case unit 41 and second case unit 42. Accordingly, the degree of freedom in forming and disposing case 4 is larger than that of the integrated case. Thus, case 4 having the optimum shape and structure can be formed according to the design and use condition of semiconductor device 10 and the shape and position of wiring terminal 5.

In the method for manufacturing semiconductor device 10 according to the first embodiment, case 4 can be disposed so as to sandwich wiring terminal 5 having the shape at the time of product use in disposing process S12. Thus, it is not necessary to further process wiring terminal 5 to be bent after connection process S11 or disposing process S12. Accordingly, in the manufacture of semiconductor device 10, the stress is prevented from being applied to wiring terminal 5 and bonding unit 53. Consequently, semiconductor device 10 having high long-term reliability can be manufactured.

Second Embodiment

A second embodiment has the same configuration, operation, and effect as those of the first embodiment described above unless otherwise specified. Consequently, the same components as those in the first embodiment are denoted by the same reference numerals, and the description thereof will not be repeated.

Figure 10:
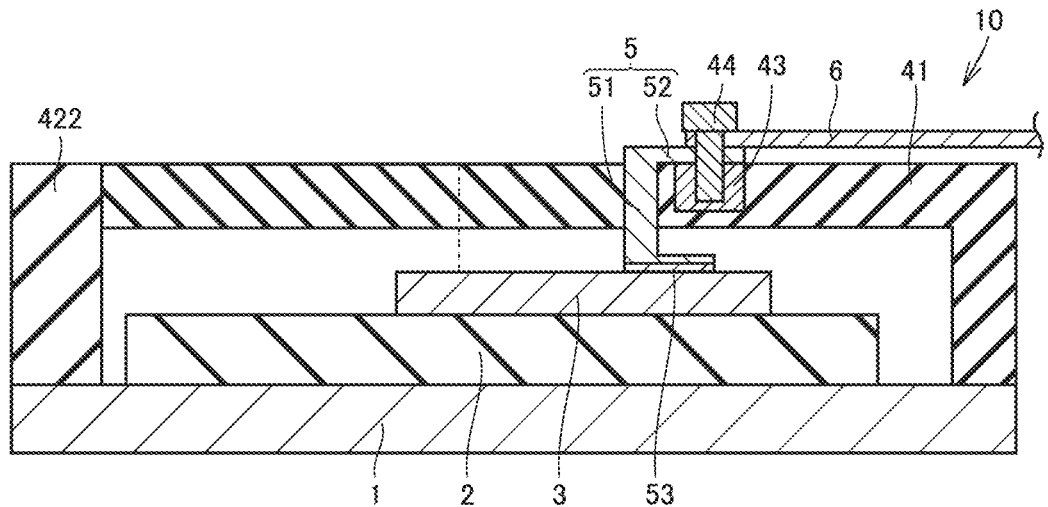
FIG. 10 is a sectional view schematically illustrating a configuration of a semiconductor device according to a second embodiment of the present invention.
Figure 11:
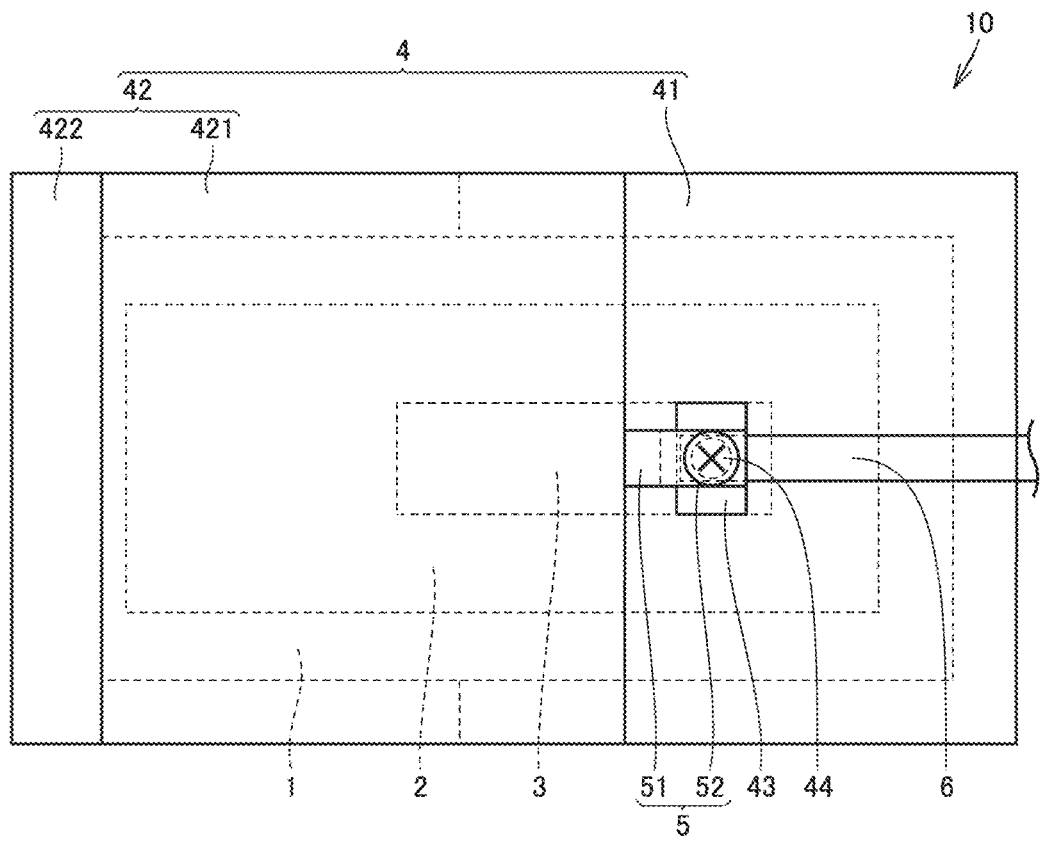
FIG. 11 is a plan view schematically illustrating the configuration of the semiconductor device according to the second embodiment of the present invention.

With reference to FIGS. 10 and 11, a configuration of semiconductor device 10 according to the second embodiment will be schematically illustrated below. FIG. 10 is a sectional view schematically illustrating the configuration of semiconductor device 10 according to the second embodiment. FIG. 11 is a plan view schematically illustrating the configuration of semiconductor device 10 according to the second embodiment.

Case 4 includes an engaged unit 43. Semiconductor device 10 further includes an engagement unit 44. Second wiring unit 52 is fastened to engaged unit 43 by engagement unit 44. Semiconductor device 10 according to the second embodiment is different from semiconductor device 10 according to the first embodiment in that case 4 further includes engaged unit 43 and that semiconductor device 10 further includes engagement unit 44.

Specifically, engaged unit 43 is a nut, a portion in which a screw hole is made, or the like. Specifically, the structure of engaged unit 43 is a structure in which a nut receiving a screw is embedded in the upper surface of case 4, a structure in which screw cutting is performed on the upper surface of case 4, or the like. Specifically, engagement unit 44 is a screw, a threaded rod, or the like. Semiconductor device 10 further includes an external wiring 6. External wiring 6 is electrically connected to an external device of semiconductor device 10. External wiring 6 is electrically connected to second wiring unit 52 at engaged unit 43. Engaged unit 43 and engagement unit 44 function as what is called a terminal block fastening second wiring unit 52 and external wiring 6.

When second wiring unit 52 and external wiring 6 are connected, engaged unit 43 and engagement unit 44 are engaged, so that a fastening property between second wiring unit 52 and external wiring 6 is improved. Thus, second wiring unit 52 and external wiring 6 are firmly fastened. Engaged unit 43 may be provided on the upper surface of case 4. In this case, engaged unit 43 supports second wiring unit 52. Engaged unit 43 can also cover a part of semiconductor element 3.

The advantageous effect of the first embodiment will be described below.

In semiconductor device 10 according to the second embodiment, engaged unit 43 and engagement unit 44 are engaged, so that a fastening effect can be obtained in engaged unit 43. Accordingly, second wiring unit 52 and external wiring 6 can be firmly fastened to case 4 by engagement unit 44 in engaged unit 43. Consequently, the long-term reliability of semiconductor device 10 is improved.

Case 4 can support second wiring unit 52 by disposing engaged unit 43 on the upper surface of case 4. The stress applied to second wiring unit 52 from the upper surface side of case 4 when second wiring unit 52 and external wiring 6 are fastened can be relaxed by the support of engaged unit 43. Accordingly, deformation of second wiring unit 52 can be prevented. Consequently, the long-term reliability of semiconductor device 10 is improved.

Third Embodiment

A third embodiment has the same configuration, operation, and effect as those of the first embodiment described above unless otherwise specified. Consequently, the same components as those in the first embodiment are denoted by the same reference numerals, and the description thereof will not be repeated.

Figure 12:
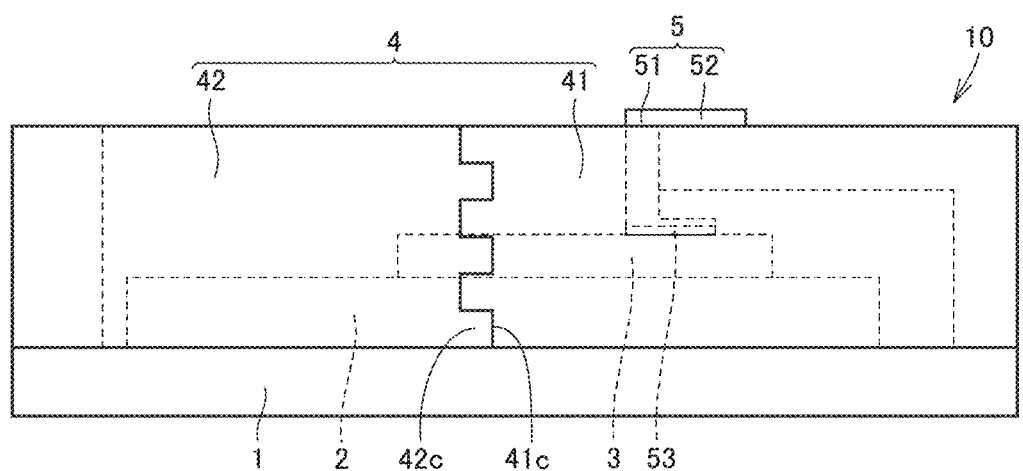
FIG. 12 is a side view schematically illustrating a first configuration of a semiconductor device according to a third embodiment of the present invention.

With reference to FIG. 12, a first configuration of semiconductor device 10 according to the third embodiment will be schematically illustrated below. FIG. 12 is a side view schematically illustrating the first configuration of semiconductor device 10 according to the third embodiment.

First case unit 41 according to the third embodiment includes a first recess 41*c*. Second case unit 42 according to the third embodiment includes a first protrusion 42*c*. First recess 41*c* is configured to be fitted to first protrusion 42*c*. Semiconductor device 10 according to the third embodiment is different from semiconductor device 10 according to the first embodiment in that first case unit 41 includes first recess 41*c* and that second case unit 42 includes first protrusion 42*c*.

Specifically, first recess 41*c* and first protrusion 42*c* have an uneven shape or a stepped shape. The unevenness or the step of first recess 41*c* and first protrusion 42*c* are bonded by the bonding material so as to be combined with each other in the divided portion. The shapes, the number of steps, the disposition, and the depth of first recess 41*c* and first protrusion 42*c* may be appropriately determined as long as the shapes provide the function and effect of the third embodiment are obtained.

A creepage distance and a bonding area in the case where first case unit 41 and second case unit 42 are bonded by first recess 41*c* and first protrusion 42*c* are larger than a creepage distance and a bonding area in the case where first case unit 41 and second case unit 42 are bonded by a vertical plane. In addition, because the creepage distance and the bonding area increase, the application distance and the application area in which the insulating bonding material is applied to case 4 also increase.

Figure 13:
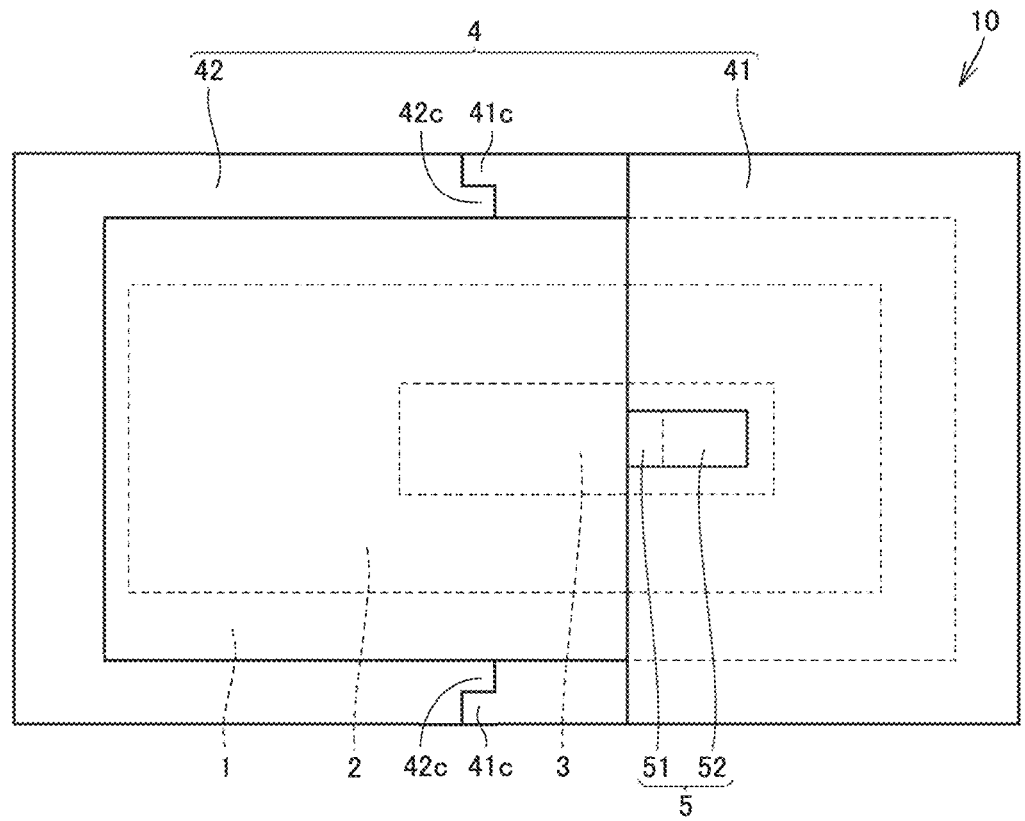
FIG. 13 is a plan view schematically illustrating a second configuration of the semiconductor device according to the third embodiment of the present invention.

FIG. 13 schematically illustrates a second configuration of semiconductor device 10 according to the third embodiment. FIG. 13 is a plan view illustrating the second configuration of semiconductor device 10 according to the third embodiment. In the second configuration of the embodiment, first recess 41*c* and first protrusion 42*c* are formed in a direction from the inside to the outside of case 4.

Figure 14:
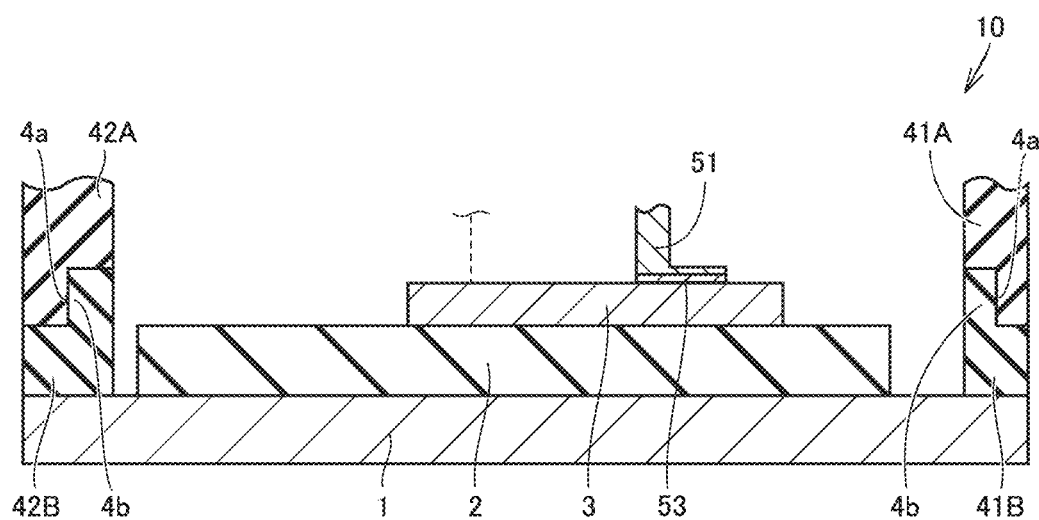
FIG. 14 is a sectional view schematically illustrating a third configuration of the semiconductor device according to the third embodiment of the present invention.

FIG. 14 schematically illustrates a third configuration of semiconductor device 10 according to the third embodiment. FIG. 14 is a plan view illustrating the third configuration of semiconductor device 10 according to the third embodiment. In the third configuration of the third embodiment, first case unit 41 and second case unit 42 include a second recess 4*a*. First case unit 41 and second case unit 42 include a second protrusion 4*b*. Second recess 4*a* is configured to be fitted to second protrusion 4b. Second recess 4a and second protrusion 4b are formed in a direction from base plate 1 toward lid 421. Specifically, first case unit 41 includes a main first case unit 41A and a sub first case unit 41B, and second case unit 42 includes a main second case unit 42A and a sub second case unit 42B. Main first case unit 41A and main second case unit 42A include second recess 4a. Sub first case unit 41B and sub second case unit 42B include second protrusion 4b.

The advantageous effect of the first embodiment will be described below.

In semiconductor device 10 according to the third embodiment, the bonding area where first case unit 41 and second case unit 42 are bonded is large, so that the bonding strength increases to more firmly bond first case unit 41 and second case unit 42. In addition, by providing unevenness in the thickness direction of case 4 by first recess 41c and first protrusion 42c, an application area where the insulating bonding material is applied to case 4 increases, so that insulation of case 4 increases.

In the third configuration of semiconductor device 10 according to the third embodiment, first case unit 41 and second case unit 42 are bonded by second recess 4a and second protrusion 4b in addition to first recess 41c and first protrusion 42c. This further increases the bonding strength and insulation of case 4.

Fourth Embodiment

A fourth embodiment has the same configuration, operation, and effect as those of the first embodiment described above unless otherwise specified. Consequently, the same components as those in the first embodiment are denoted by the same reference numerals, and the description thereof will not be repeated.

Figure 15:
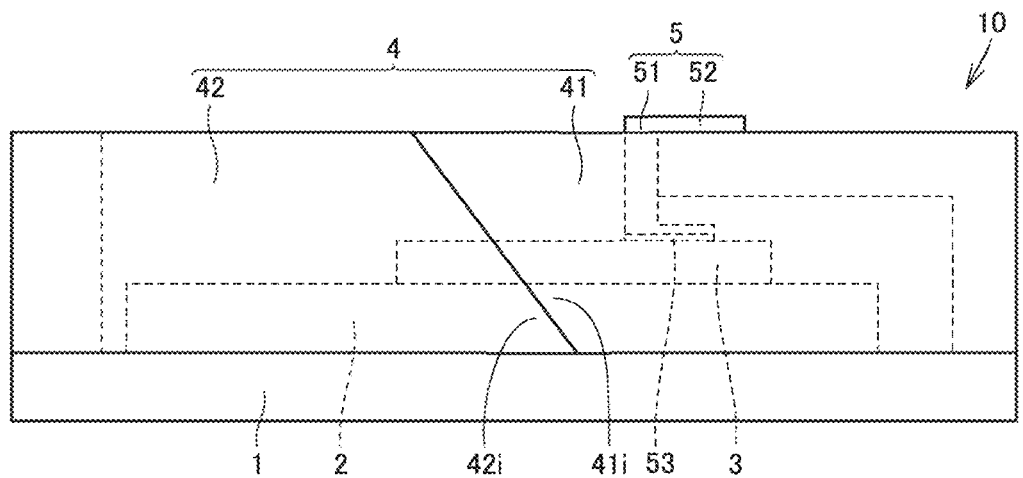
FIG. 15 is a side view schematically illustrating a configuration of a semiconductor device according to a fourth embodiment of the present invention.

With reference to FIG. 15, a configuration of semiconductor device 10 according to the fourth embodiment will be schematically illustrated below. FIG. 15 is a side view schematically illustrating the configuration of semiconductor device 10 according to the fourth embodiment.

First case unit 41 according to the fourth embodiment includes a first inclined unit 41i. Second case unit 42 according to the fourth embodiment includes a second inclined unit 42i. First inclined unit 41i is inclined along second inclined unit 42i. Semiconductor device 10 according to the fourth embodiment is different from semiconductor device 10 according to the first embodiment in that first case unit 41 includes first inclined unit 41i and that second case unit 42 includes second inclined unit 42i.

First inclined unit 41i and second inclined unit 42i are inclined with respect to the direction in which base plate 1 and case 4 overlap each other. First inclined unit 41i and second inclined unit 42i are configured such that inclined surfaces of first inclined unit 41i and second inclined unit 42i are in contact with each other. With this configuration, first inclined unit 41i and second inclined unit 42i are fitted in the divided portion.

The positions at which first inclined unit 41i and second inclined unit 42i are provided, the length of the inclination, the inclination angle, the inclination direction, and the like may be appropriately determined according to the performance of intended semiconductor device 10. In order to obtain the effect of the fourth embodiment, desirably one of first inclined unit 41i and second inclined unit 42i faces the upper side of base plate 1 and is disposed so as not to have a blind spot.

In the case where a blind spot does not exist from the upper side of base plate 1, all regions of either first inclined unit 41i or second inclined unit 42i facing the upper side are projected onto base plate 1 when the divided portion is projected onto base plate 1 from the vertical direction with respect to base plate 1. Furthermore, for example, even when the inclined surface is a curved surface, when the divided portion is projected onto base plate 1 from the vertical direction, all the regions of the curved surface can be projected. For this reason, in order to obtain the function and effect of the fourth embodiment, first inclined unit 41i and second inclined unit 42i are not limited to an inclined surface formed only of a flat surface. For example, first inclined unit 41i and second inclined unit 42i may include curved surfaces.

The advantageous effect of the first embodiment will be described below.

When first case unit 41 and second case unit 42 are bonded, the bonding material is applied to the divided portion from the upper side of base plate 1. As in the third embodiment, when the unevenness or the step exists between first case unit 41 and second case unit 42, the blind spot from the upper side of base plate 1 may be generated in the divided portion. In addition, when the unevenness or the step exists between first case unit 41 and second case unit 42 as in the third embodiment, the unevenness or the step may cause an insufficient space for application. For these reasons, the bonding material cannot be uniformly applied between first case unit 41 and second case unit 42, and there is a possibility that the bonding strength and the insulation are lowered.

In the fourth embodiment, first inclined unit 41i and second inclined unit 42i are inclined with respect to the upper side of base plate 1. For this reason, either first inclined unit 41i or second inclined unit 42i has no blind spot from the upper surface of case 4. Accordingly, the bonding material can be uniformly applied between first case unit 41 and second case unit 42. Thus, the bonding strength and the insulation of case 4 can be enhanced, so that the long-term reliability of semiconductor device 10 increases.

In the fourth embodiment, first case unit 41 may further include first recess 41c, and second case unit 42 may further include first protrusion 42c. In this case, the position, orientation, number, and the like at which the inclination is provided can be appropriately set according to the intended performance. Specifically, first recess 41c and first protrusion 42c are provided so as not to generate the blind spot from the upper surface of case 4. Thus, the long-term reliability of semiconductor device 10 can be increased, and the bonding strength and the insulation of case 4 can be enhanced.

Fifth Embodiment

The fifth embodiment has the same configuration, operation, and effect as those of the first embodiment described above unless otherwise specified. Consequently, the same components as those in the first embodiment are denoted by the same reference numerals, and the description thereof will not be repeated.

Figure 16:
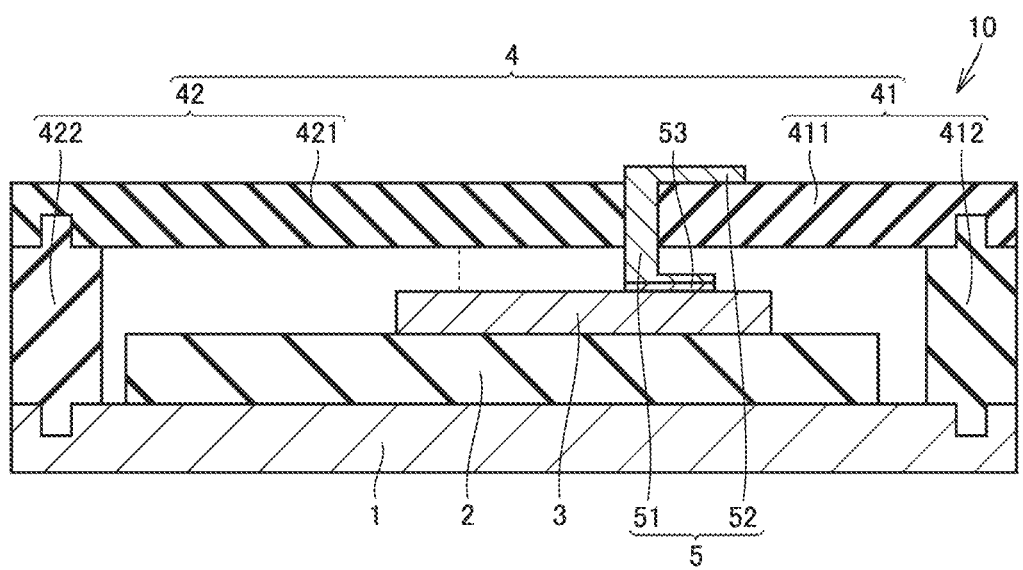
FIG. 16 is a sectional view schematically illustrating a first configuration of a semiconductor device according to a fifth embodiment of the present invention.
Figure 17:
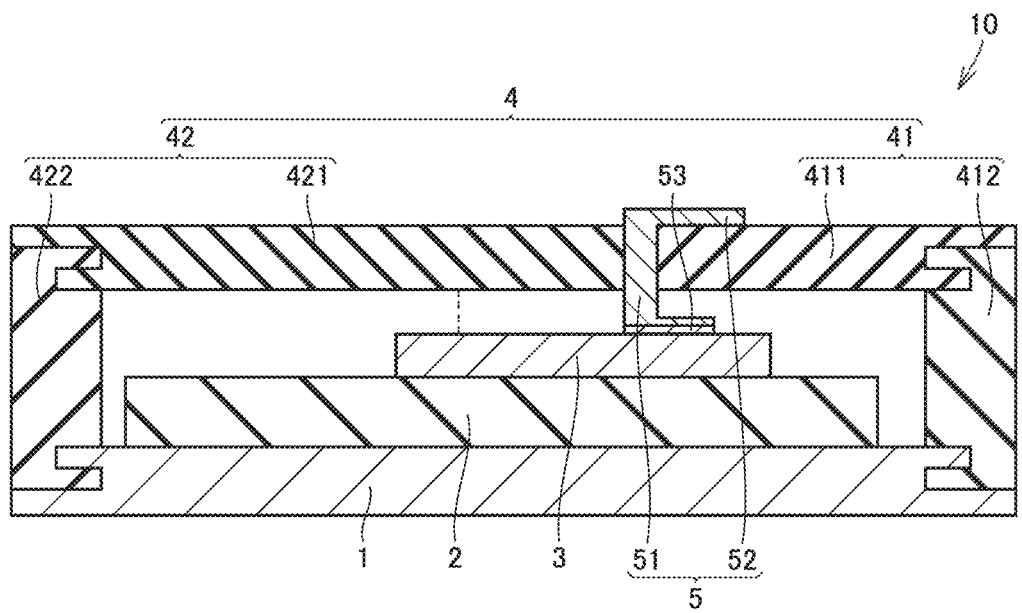
FIG. 17 is a sectional view schematically illustrating a second configuration of the semiconductor device according to the fifth embodiment of the present invention.

With reference to FIGS. 16 and 17, a configuration of semiconductor device 10 according to the fifth embodiment will be schematically illustrated below. FIG. 16 is a sectional view schematically illustrating a first configuration of semiconductor device 10 according to the fifth embodiment. FIG.

17 is a sectional view schematically illustrating a second configuration of semiconductor device 10 according to the fifth embodiment.

First case unit 41 according to the embodiment includes a first lid 411 and a first main body 412. First lid 411 includes a first upper recess. First main body 412 includes a first upper protrusion and a first lower protrusion. Base plate 1 includes a first lower recess. First upper recess and first upper protrusion are fitted. First lower recess and the first lower protrusion are fitted.

Lid 421 of second case unit 42 includes a second upper recess. Main body 422 of second case unit 42 includes a second upper protrusion and a second lower protrusion. Base plate 1 includes a second lower recess. The second upper recess and the second upper protrusion are fitted to each other. The second lower recess and the second lower protrusion are fitted to each other.

The advantageous effect of the first embodiment will be described below.

In semiconductor device 10 according to the fifth embodiment, the distance and area in which case 4 and base plate 1 are bonded are large, so that the bonding strength increases to more firmly bond case 4 and base plate 1. In addition, the creepage distance and the bonding area are increased by increasing the distance and the area at which case 4 and base plate 1 are bonded, so that the insulation increases.

Sixth Embodiment

In a sixth embodiment, the semiconductor device according to any one of the first to fifth embodiments described above is applied to a power conversion device. Although the present invention is not limited to a specific power conversion device, the case that the present invention is applied to a three-phase inverter will be described below as the sixth embodiment.

Figure 18:
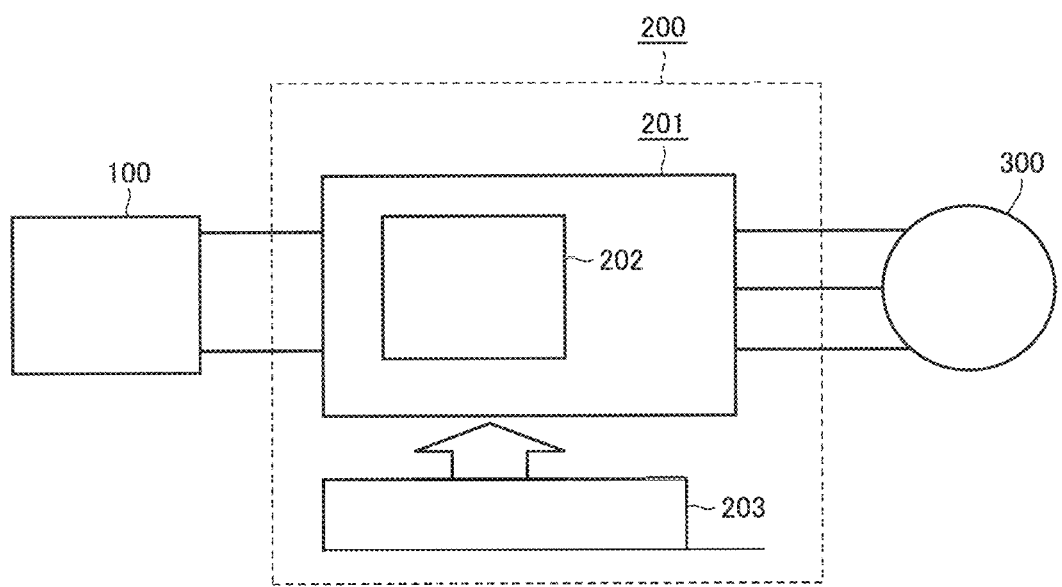
FIG. 18 is a block diagram illustrating a configuration of a power conversion system according to a sixth embodiment of the present invention.

FIG. 18 is a block diagram illustrating a configuration of a power conversion system to which the power conversion device according to the sixth embodiment is applied.

The power conversion system in FIG. 18 includes a power supply 100, a power conversion device 200, and a load 300. Power supply 100 is a DC power supply, and supplies DC power to power conversion device 200. Power supply 100 can be configured by various components. For example, power supply 100 can be configured by a DC system, a solar cell, and a storage battery, or may be configured by a rectifier circuit connected to an AC system or an AC/DC converter. Power supply 100 may be constructed with a DC-DC converter that converts the DC power output from the DC system into predetermined power.

Power conversion device 200 is a three-phase inverter connected between power supply 100 and load 300, converts the DC power supplied from power supply 100 into AC power, and supplies the AC power to load 300. As illustrated in FIG. 18, power conversion device 200 includes a main conversion circuit 201 that converts the DC power into the AC power to output the AC power and a control circuit 203 that outputs a control signal controlling main conversion circuit 201 to main conversion circuit 201.

Load 300 is a three-phase motor driven by the AC power supplied from power conversion device 200. Load 300 is not limited to a specific application, but is a motor mounted on various electric appliances. For example, load 300 is used as a hybrid car, an electric car, a rail vehicle, an elevator, or a motor for an air conditioner.

Power conversion device 200 will be described in detail below. Main conversion circuit 201 includes a switching element and a reflux diode (not illustrated), converts the DC power supplied from power supply 100 into the AC power by switching of the switching element, and supplies the AC power to load 300. Although there are various specific circuit configurations of main conversion circuit 201, main conversion circuit 201 according to the sixth embodiment is a two-level three-phase full bridge circuit, and can be configured by six switching elements and six reflux diodes connected in anti-parallel to the respective switching elements. Each switching element and each reflux diode of main conversion circuit 201 are configured by semiconductor module 202 corresponding to any one of the above-described first to fifth embodiments. Six switching elements are connected in series in every two switching elements to constitute upper and lower arms, and each of upper and lower arms constitutes each phase (U-phase, V-phase, W-phase) of the full bridge circuit. An output terminal of each of the upper and lower arms, namely, three output terminals of main conversion circuit 201 are connected to load 300.

Furthermore, main conversion circuit 201 includes a drive circuit (not illustrated) that drives each switching element, the drive circuit may be built in semiconductor module 202, or may include a drive circuit separately from semiconductor module 202. The drive circuit generates a drive signal driving the switching element of main conversion circuit 201, and supplies the drive signal to the control electrode of the switching element of main conversion circuit 201. Specifically, the drive signal turning on the switching element and the drive signal turning off the switching element are output to the control electrode of each switching element according to the control signal from control circuit 203 (described later). The drive signal is a voltage signal (on-signal) greater than or equal to a threshold voltage of the switching element when the switching element is maintained in an on-state, and the drive signal is a voltage signal (off-signal) smaller than or equal to the threshold voltage of the switching element when the switching element is maintained in an off-state.

Control circuit 203 controls the switching elements of main conversion circuit 201 such that desired power is supplied to load 300. Specifically, time (on-time) during which each switching element of main conversion circuit 201 is to be turned on is calculated based on the power to be supplied to load 300. For example, main conversion circuit 201 can be controlled by PWM control that modulates the on-time of the switching element according to the voltage to be output. A control command (control signal) is output to the drive circuit included in main conversion circuit 201 such that the on-signal is output to the switching element to be turned on at each time point, and such that the off-signal is output to the switching element to be turned off at each time point. The drive circuit outputs the on-signal or the off-signal as the drive signal to the control electrode of each switching element according to the control signal.

In the power conversion device according to the sixth embodiment, the semiconductor module according to any one of the first to fifth embodiments is applied as the switching element and the reflux diode of main conversion circuit 201, so that the reliability of the power conversion device can be implemented.

Although the example in which the present invention is applied to the two-level three-phase inverter is described in the sixth embodiment, the present invention is not limited to the sixth embodiment, but can be applied to various power conversion devices. In the sixth embodiment, the two-level power conversion device is used.

However, a three-level or multi-level power conversion device may be used, or the present invention may be applied to a single-phase inverter when the power is supplied to a single-phase load. In addition, the present invention can also be applied to a DC/DC converter or an AC/DC converter when the power is supplied to a DC load or the like.

In addition, the power conversion device to which the present invention is applied is not limited to the case where the load described above is the electric motor, but can also be used as, for example, a power supply device for an electric discharge machine, a laser beam machine, an induction heating cooker, or a non-contact power feeding system, and can also be used as a power conditioner for a solar power generation system, and a power storage system.

It should be considered that the disclosed embodiments are an example in all respects and not restrictive. The scope of the present invention is defined by not the description above, but the claims, and it is intended that all modifications within the meaning and scope of the claims and their equivalents are included in the present invention.

REFERENCE SIGNS LIST

1: base plate, 2: substrate, 3: semiconductor element, 4: case, 5: wiring terminal, 10: semiconductor device, 41: first case unit, 42: second case unit, 51: first wiring unit, 52: second wiring unit, 100: power supply, 200: power conversion device, 201: main conversion circuit, 202: semiconductor module, 203: control circuit, 300: load

The invention claimed is:

1. A semiconductor device comprising:
   a base plate;
   a substrate disposed on the base plate;
   a semiconductor element electrically connected to the substrate;
   a case disposed on the base plate so as to cover the substrate and the semiconductor element; and
   a wiring terminal electrically connected to the semiconductor element,
   wherein the case includes a first case unit and a second case unit,
   the wiring terminal includes a first wiring unit disposed so as to protrude from an inside of the case to an outside and bonded to at least one of the semiconductor element and the substrate, and a second wiring unit bent with respect to the first wiring unit and disposed outside the case,
   the first case unit and the second case unit are disposed so as to sandwich the first wiring unit at a predetermined section of the first wiring unit,
   the first case unit and the second case unit are disposed so as to contact each other at a boundary of the first case unit and the second case unit except for the predetermined section of the first wiring unit, and
   the boundary is overlapped with the base plate in a top view of the semiconductor device.

2. The semiconductor device according to claim 1, further comprising an engagement unit,
   wherein the case further includes an engaged unit, and
   the second wiring unit is fastened to the engaged unit by the engagement unit.

3. The semiconductor device according to claim 2, wherein
   the first case unit includes a first recess,
   the second case unit includes a first protrusion, and
   the first recess is fitted to the first protrusion.

4. The semiconductor device according to claim 3, wherein
   the first case unit and the second case unit include a second recess,
   the first case unit and the second case unit include a second protrusion, and
   the second recess is fitted to the second protrusion.

5. The semiconductor device according to claim 2, wherein
   the first case unit includes a first inclined unit,
   the second case unit includes a second inclined unit, and
   the first inclined unit is inclined along the second inclined unit.

6. The semiconductor device according to claim 1, wherein
   the first case unit includes a first recess,
   the second case unit includes a first protrusion, and
   the first recess is fitted to the first protrusion.

7. The semiconductor device according to claim 6, wherein
   the first case unit and the second case unit include a second recess,
   the first case unit and the second case unit include a second protrusion, and
   the second recess is fitted to the second protrusion.

8. The semiconductor device according to claim 1, wherein
   the first case unit includes a first inclined unit,
   the second case unit includes a second inclined unit, and
   the first inclined unit is inclined along the second inclined unit.

9. A power conversion device comprising:
   a main conversion circuit including the semiconductor device according to claim 1 and to convert and output input power; and
   a control circuit to output a control signal controlling the main conversion circuit to the main conversion circuit.

10. A method for manufacturing a semiconductor device, the method comprising:
    electrically connecting a first wiring unit of a wiring terminal including the first wiring unit and a second wiring unit bent with respect to the first wiring unit to a semiconductor element electrically connected to a substrate disposed on a base plate;
    disposing a case including a first case unit and a second case unit so as to cover the substrate disposed on the base plate and the semiconductor element; and
    joining the first case unit and the second case unit at a boundary of the first case unit and the second case unit, the wiring terminal passing through the boundary,
    wherein in the disposing, the first wiring unit is between the first case unit and the second case unit such that the first wiring unit of the wiring terminal protrudes from an inside to an outside of the case and the second wiring unit is disposed outside the case, and
    wherein the boundary is overlapped with the base plate in a top view of the semiconductor device.

* * * * *